United States Patent [19]

Kaplan

[11] 4,092,609
[45] May 30, 1978

[54] CIRCUIT FOR REDUCING RIPPLE VOLTAGE

[75] Inventor: Leonard Abraham Kaplan, Fords, N.J.

[73] Assignee: RCA Corporation, New York, N.Y.

[21] Appl. No.: 686,454

[22] Filed: May 14, 1976

[51] Int. Cl.² .............................................. H03F 1/26
[52] U.S. Cl. .................................... 330/149; 330/199; 330/296; 330/297
[58] Field of Search ................ 330/149, 199, 296, 297

[56] References Cited

U.S. PATENT DOCUMENTS 1,806,813  5/1931  Miessner .......................... 330/149 X
3,042,877  7/1962  Barnes ................................. 330/149

Primary Examiner—Lawrence J. Dahl
Attorney, Agent, or Firm—H. Christoffersen; Allen LeRoy Limberg

[57] ABSTRACT

An imperfectly filtered d.c. operating voltage is applied to an electrode, such as the emitter electrode of an output transistor, an input signal being applied to another electrode, such as the base electrode of the transistor. The ripple component thereby induced at the collector electrode of this transistor is cancelled by adjusting to a value exactly equal thereto, the complementary ripple component of the d.c. operating voltage applied to the collector electrode.

9 Claims, 2 Drawing Figures

CIRCUIT FOR REDUCING RIPPLE VOLTAGE

This invention relates generally to circuits, such as power amplifiers and mixers, which include means for reducing undesirable ripple components in the output signal.

It is desirable in hi-fidelity audio equipments to reduce to a minimum the "hum" in the audio output signal. The hum is due to ripple voltage (a.c.) components of the d.c. operating voltages, which voltages are generally obtained from unregulated and/or imperfectly filtered power supplies. The hum may be reduced to an acceptable level by passive circuits, such as resistor-capacitor filters, which shunt the a.c. ripple to ground but at the expense of frequency response. It is also known (see Wilbur, Fichtner, and Anderson U.S. Pat. Nos. 3,604,203, 3,389,344 and 3,441,868 respectively), to use reactive components to couple ripple voltages to an input terminal of an amplifier, to cause a ripple voltages to an input terminal of an amplifier, to cause a ripple voltage of one phase and amplitude to appear across a load resistor, for combination with and cancellation of another ripple voltage applied directly to the load resistor. However, it is found that directly mixing ripple voltages with input signals sometimes causes distortion of the input signal. Also, the reactive components can cause phase shifts which result in imperfect cancellation of the ripple voltages. Also, when circuits are implemented in monolithic integrated circuit form, it is preferable to avoid the use of reactive components because they cannot readily be integrated.

The circuits of the present application include means for directly applying a ripple voltage $V_x$ to an output electrode of a solid state device, such as a transistor, and means for applying to a second electrode of the device a second ripple voltage $V_Y$ which appears at the output electrode complementary to $V_x$. The signal voltage is applied to a third electrode of the device. Means are provided for controlling the amplitude of at least one of $V_x$ and $V_Y$ for obtaining cancellation of the ripple components at the output electrode.

Figure 1:
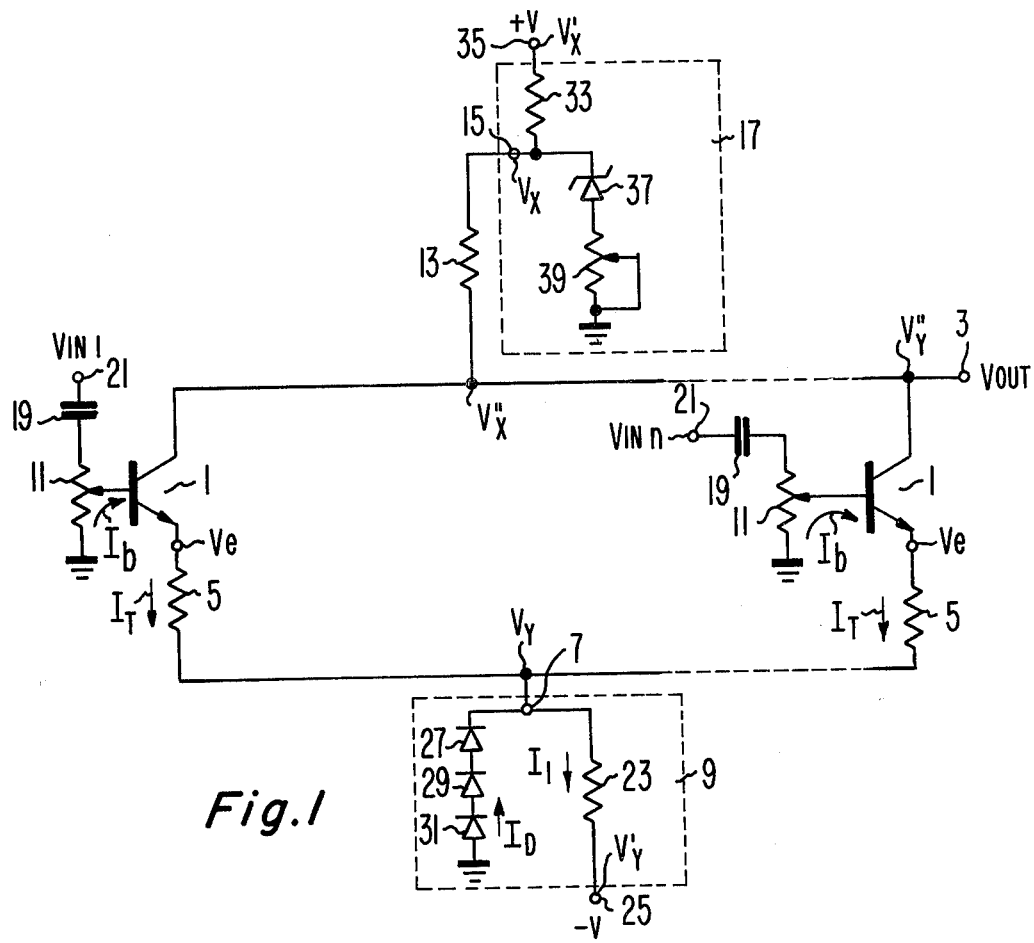
FIG. 1 is a circuit diagram of one embodiment of the invention.

In FIG. 1, a plurality of transistors 1 each have respective collector electrodes connected in common to an output terminal 3, respective emitter electrodes connected via respective emitter resistors 5 to the voltage output terminal 7 of a sub-power supply 9, and respective base electrodes connected to the arms of respective potentiometers 11. A load resistor 13 is connected between a voltage output terminal 15 of another sub-power supply 17, and the commonly connected collector electrodes of the transistors 1. Each potentiometer 11 is connected at one terminal to a point of reference potential, ground in this example, and another terminal via a respective one of coupling capacitors 19 to a respective one of signal input terminal 21.

The sub-power supply 9 provides a negative operating voltage at its output terminals 7, and includes a resistor 23 connected between output terminal 7 and a power terminal 25, to which a negative operating voltage $-V$ is applied. A series string of three diodes 27, 29, 31 is connected in the forward direction between terminal 7 and ground.

The other sub-power supply 17 includes a resistor 33 connected between output terminal 15 and a power terminal 35 to which a positive operating voltage $+V$ is applied. A series circuit comprising zener diode 37 and variable resistor 39 is connected between terminal 15 and ground.

In the operation of the circuit of FIG. 1, if only one transistor 1 is connected as shown, the circuit is a common-emitter amplifier. If a plurality N of transistors 1 are connected as shown, the circuit becomes a common-emitter configured mixer circuit, for mixing up to $n$ individual input signals $V_{INn}$ ($n$ representing the total number of transistors 1). When obtained from a common supply which operates from a common a.c. source, such as the 60 Hz power line, a d.c. operating voltage such as $+V$ may include a ripple component of one phase and the d.c. voltage $-V$ of opposite polarity will include a ripple component of opposite phase. This is generally true provided full-wave rectification is used. In this case, the ripple frequency is twice the power line frequency. In general, these two ripple components will not be of the same amplitude at output terminal 3 and a resultant will be produced which manifests itself as hum.

In the circuit of the present application, the problem above is overcome by providing two sub-power supplies 9 and 17, which produce d.c. voltages at terminals 7 and 15 at the level required for proper operation of transistors 1, while permitting control of the relative values of the ripple components $V_Y$ and $V_x$. By adjustment of variable resistor 39, the component of $V_Y$ appearing at output terminal 3 can be made to be exactly equal to the component of $V_x$ appearing there, without significantly affecting the d.c. operating voltage levels. Thus, hum can be substantially eliminated either when the circuit is operated as a d.c. amplifier or mixer (capacitors 19 are eliminated or shorted), or when it is operated as an a.c. amplifier or mixer (coupling capacitors 19 connected as shown).

The operation is explained perhaps most clearly by the equations which follow:

$$I_1 = \frac{-V + 3V_{be}}{R_{23}} \quad (1)$$

where $I_1$ is the current flowing through the series circuit of diodes 27, 29, 31 and resistor 23 having a resistance $R_{23}$, and $3V_{be}$ represents three diode drops (the voltage across diodes 27, 29, 31).

$$I_T = \frac{3V_{be} - V_e}{R_5} \quad (2)$$

where $I_T$ is the current flowing through each one of the emitter resistors 5 each having a resistance $R_5$, and $V_e$ is the value of voltage at each one of the emitter electrodes of the transistors 1, $$V_e = V_b + V_{be} \quad (3)$$

where $V_b$ is the voltage at the base electrodes of the transistors 1.

$$V_b = I_b R_{11} \quad (4)$$

where $I_b$ is the base current of each one of the transistors 1, and $R_{11}$ is the value of resistance between the arm of potentiometer 11 and ground. In a practical circuit, the value of $R_{11}$ will be so low, that $V_b$ may be neglected in that its value will be substantially less than $1V_{be}$.

$$I_D = I_1 - nI_T \quad (5)$$

where $I_D$ is the actual magnitude of current flowing through the diode string 27, 29, 31, and $n$ is total number of transistors 1.

$$Z_D = \frac{\left(n\frac{kT}{q}\right)}{I_D} = \frac{3 \times 26mv}{I_D ma} \quad (6)$$

where $Z_D$ is the a.c. impedance of the diode string (27, 29, 31), $n$ is the number of such diodes (three in this case), and $kT/q = 26mv$, where $k$ is Boltzman's constant, T is temperature in degrees Kelvin at 25° C, and $q$ is the charge on an electron.

$$V_Y = \left(\frac{Z_D}{Z_D + R_{23}}\right) V_Y' \quad (7)$$

where $V_Y$ is the value of the negative ripple voltage at output terminal 7 of sub-power supply 9, and $V_Y'$ is value of the ripple voltage from $-V$ appearing at power terminal 25. Note: $R_5 >> Z_D$; therefore the effect of $R_5$ upon $V_Y$ is negligible.

$$V_Y'' = \left(\frac{V_Y - V_e}{R_5}\right)(nR_{13}) \quad (8)$$

where $V_Y''$ is the value of negative ripple appearing at output terminal 3, and $R_{13}$ is the value of collector load resistor 13. This assumes that the value of resistor 13 is much larger than the a.c. resistance between node 15 and ground, that is, node 15 is essentially at a.c. ground with respect to the ripple component $V_Y''$.

The value of the positive ripple voltage $V_X$ at output terminal 15 of sub-power supply 17 must be of a value such that the positive ripple $V_X''$ at output terminal 3 cancels $V_Y''$, that is, $V_X'' = V_Y''$. It can be shown that $$V_X \simeq V_X'' \quad (9)$$

This is so because the impedance between the collector electrodes of transistors 1 and ground is extremely high in comparison to the value of resistor 13 ($R_{13}$). Therefore, there is virtually no attenuation of $V_X$ between output terminal 15 of sub-power supply 17, and output terminal 3 of the amplifier or mixer.

It is clear from the circuit that:

$$V_x = V_x'' = \frac{R_{39} + R_Z}{R_{39} + R_Z + R_{33}} (V_x') \quad (10)$$

Where $R_{39}$ is the value of variable resistor 39, $R_{33}$ is the value of resistor 33, $R_Z$ is the internal resistance of zener diode 37, when in zener breakdown, and $V_{x'}$ is the value of the ripple component of the operating voltage $+V$. The equation shows that as $R_{39}$ is increased, $V_x''$ increases and vice versa. Thus, by appropriate adjustment of variable resistor 39, $V_x''$ can be made equal to $V_y''$, that is, $|V_y''| = |V_x''|$, to a very close approximation to thereby substantially eliminate the hum.

The zener diode 37 is an important feature of the circuit, and can be integrated. It provides regulation, has a low but finite internal resistance, provides sufficient d.c. operating voltage, is not bulky, and is of relatively low cost. The internal resistance $R_Z$ is low in comparison to the value of potentiometer 39, permitting the latter to predominate in adjusting or controlling the value of ripple $V_x$.

It is possible in the circuit of FIG. 1 to replace the zener diode with a parallel resistor capacitor (RC) network. The capacitor would have to have an impedance about 10 times lower than that of its parallel resistor to ensure that substantially all of the positive ripple voltage would be by-passed to potentiometer 39. This alternative is not preferred because the capacitor can, if it is not sufficiently large or has poor power factor, introduce a phase shift to the positive ripple $V_x$, making the ripple cancellation poorer. Moreover, the parallel RC circuit is more expensive than and takes up more space than the zener diode.

Typical values of the circuit components for FIG. 1 are given in Table 1 which follows, where $n = 4$ (four transistor amplifier stages are used in this circuit).

TABLE 1

| Reference Numeral | Component Type | Value* |
|---|---|---|
| +V | — | +42 volts |
| −V | — | −42 volts |
| 1 | Transistor | RCA 2102 |
| 5 | Resistor | 3.9K |
| 11 | Potentiometer | 100K |
| 13 | Resistor | 20K |
| 19 | Capacitor | 0.22 |
| 23 | Resistor | 8.2K |
| 27, 29, 31 | Silicon Diode | — |
| 33 | Resistor | 3.3K |
| 37 | Zener Diode | 30 volts |
| 39 | Variable Resistor | 250 |

*All resistor values are in ohms, and all capacitor values are in microfarads.

Figure 2:
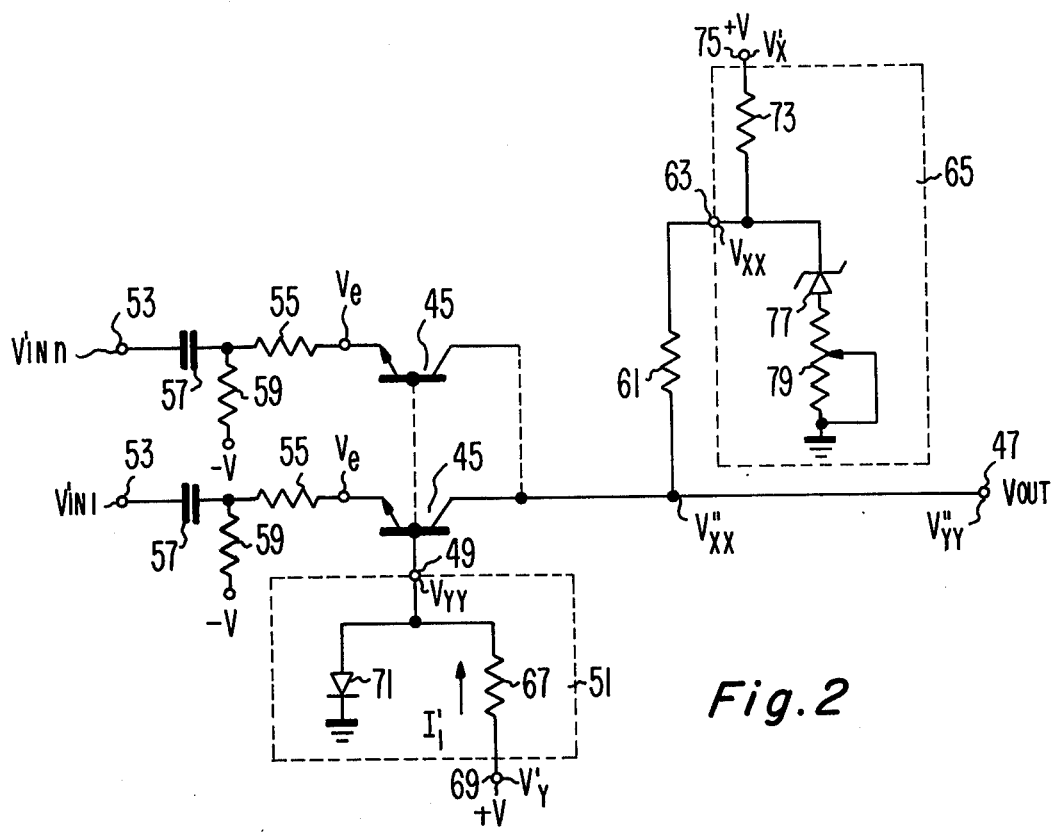
FIG. 2 is a circuit diagram of a second embodiment of the invention.

The ripple cancelling technique discussed above also can be used in common-base amplifier or mixer circuits, as shown in FIG. 2. In this circuit a plurality of transistors 45 each have collector electrodes connected in common to an output terminal 47, base electrodes connected in common to an output terminal 49 of a sub-power supply 51, and emitter electrodes. Each emitter electrode is coupled to a respective one of input signal terminals 53. For a.c. operation, the coupling may be via a respective one of series resistors 55 and coupling capacitors 57. Each circuit also includes a respective one of pull down resistors 59 connected from a connection between the coupling capacitor and series resistor to a terminal for a negative operating voltage $-V$. These pull-down resistors 59 bias transistors 45 for tracking a.c. input signals $V_{IN1}$ through $V_{INn}$ in a desired dynamic range, where $n$ is the total number of transistors 45. For d.c. operation, the capacitors 57 may be eliminated (short circuited) and the pull down resistors 59 may be removed (open circuited). For both a.c. and d.c. operation, a load or collector resistor 61 is connected between output terminal 47 and output terminal 63 of another sub-power supply 65.

The two sub-power supplies 51 and 65 are similar to those shown in FIG. 1. However, only a single diode 71 is used in the circuit 51 rather than the string of three employed in sub-supply 9 of FIG. 1. The number of diodes employed, which is a matter of engineering design, determine the d.c. level (and ripple level) at node 49. Also, in the FIG. 2 circuit both the base and collector electrodes are at a positive level ($+V$ at both terminals 69 and 75), whereby diode 71 is connected at its anode to the base electrode of transistor 45 and at its cathode to ground.

The operation is quite analogous to that of the FIG. 1 circuit. The ripple component $V_{yy}$ available at the base electrodes of transistors 45 appears in inverted form $V_{yy}''$ at the common collector connection of these transistors, that is, at output terminal 47. The ripple component $V_{xx}''$ produced by sub-power supply 65 appears in uninverted form at the same terminal 47. Thus, $V_{XX}''$ is complementary to $V_{YY}''$. By proper adjustment of variable resistor 79, the absolute value of $V_{xx}''$ can be made equal to that of $V_{YY}''$, thereby cancelling the ripple.

The common-emitter mixer circuit of FIG. 1 has a high input impedance at input terminals 21. In comparison, the common-base mixer circuit of FIG. 2 has a relatively low input impedance at input terminals 53. For ripple cancellation and operation, both negative and positive operating voltages $+V$, $-V$ are required in the circuit of FIG. 1. Ripple cancellation can be accomplished in the circuit of FIG. 2 with a single polarity operating voltage $+V$. As previously a single polarity operating voltage $+V$. As previously mentioned, d.c. coupling can be accomplished in the circuit of FIG. 2, by shorting coupling capacitors 57 and eliminating resistors 59. Similarly, d.c. coupling can be accomplished in the circuit of FIG. 1 by shorting coupling capacitors 19. For a.c. coupling in the circuit of FIG. 2, as described, any negative ripple from the bias voltage $-V$ applied to resistors 59 is assumed to be shunted to ground via the current paths including coupling capacitors 57, and the output impedances of the signal sources providing signal inputs $V_{INn}'$ (assuming such output impedances to be substantially less than the input impedances of the common-base amplifiers).

While in the two circuits discussed, the $V_y$ ripple component is fixed and means are provided for adjusting the $V_x$ ripple component, it is to be understood that this is an example only as other alternatives are possible. For example, a small value of variable resistance may be inserted in series with the diode string 27, 29, 31 of FIG. 1 for controlling the amplitude of $V_y$ (and thereby $V_y''$) to make $V_y''$ exactly equal to $V_x''$. In this case, the anode of zener diode 37 may be connected directly to ground. Alternatively, resistor 39 may remain in the circuit to provide a wider range of control, that is, to permit adjustment of $V_x''$ as well as $V_y''$.

What is claimed is:

1. In combination:
   a current control device having input, output and common electrodes and having a principal conduction path between its output and common electrodes, the current flow through which path is increased and decreased responsive to the potential between its common and input electrodes being increased and decreased, substantially independently of the potential between its common and output electrodes;
   first and second resistances, each having a first end and a second end, the first ends of said first and said second resistances connected respectively to the common electrode of said current control device and to its output electrode;
   means for applying an input signal potential, as referred to a reference voltage, to the input electrode of said current control device;
   means responsive to a first supply voltage received at an input terminal thereof to apply a first operating potential from an output terminal thereof to the second end of said first resistance, and means responsive to a second supply voltage received at an input terminal thereof to apply a second operating potential from an output terminal thereof to the second end of said second resistance, said first and second operating voltages having respective direct components respectively of a first polarity and of a second polarity as referred to said reference voltage for conditioning the principal conduction path of said current control device to conduct current, said first and second operating voltages having respective ripple components of opposite senses from each other and of predetermined proportions relative to each other; and
   adjustment means, included in one of said means for applying first and second operating voltages, for adjusting the ripple component available from its output terminal thereby to substantially reduce the ripple component in the potential at the first end of said second resistance, as tends to accompany an output signal potential appearing there responsive to said input signal potential.

2. A combination as set forth in claim 1 wherein the one of said means for applying an operating potential that includes said adjustment means includes:
   a third resistance connected between its input and output terminals; and
   a fourth, adjustable resistance and a reference diode serially connected between its input terminal and a point at said reference voltage, the adjustment of said fourth resistance substantially affecting the ripple component of the operating voltage at its output terminal as compared to its affecting the direct component of the operating voltage at its output terminal.

3. In combination:
   a current control device having input, output and common electrodes and having a principal conduction path between its output and common electrodes, the current flow through which path is increased and decreased responsive to the potential between its common and input electrodes being increased and decreased, substantially independently of the potential between its common and output electrodes;
   first and second resistances, each having a first end and a second end, the first ends of said first and said second resistances connected respectively to the common electrode of said current control device and to its output electrode;
   means for applying an input signal potential, as referred to a reference voltage, to the second end of said first resistance;
   means responsive to a first supply voltage received at an input terminal thereof to apply a first operating potential from an output terminal thereof to the input electrode of said current control device, and means responsive to a second supply voltage received at an input terminal thereof to apply a second operating potential from an output terminal thereof to the second end of said second resistance, said first and second operating voltages having respective direct components respectively of the same polarity as referred to said reference voltage for conditioning the principal conduction path of said current control device to conduct current, said first and second operating voltages having respective ripple components of similar sense to each other and of predetermined proportions relative to each other; and adjustment means, included in one of said means for applying first and second operating voltages, for adjusting the ripple component available from its output terminal, thereby to substantially reduce the ripple component in the potential at the first end of said second resistance, as tends to accompany an output signal potential appearing there responsive to said input signal potential.

4. A combination as set forth in claim 2 wherein the one of said means for applying an operating potential that includes said adjustment means includes:
   a third resistance connected between its input and output terminals; and
   a fourth, adjustable resistance and a reference diode serially connected between its input terminal and a point at said reference voltage, the adjustment of said fourth resistance substantially affecting the ripple component of the operating voltage at its output terminal as compared to its affecting the direct component of the operating voltage at its output terminal.

5. A mixer comprising:
   a plurality of current control devices, $n$ in number, each having input and output and common electrodes and having a principal conduction path between its output and common electrodes, the current flow through which path is increased and decreased responsive to the potential between its common and input electrodes being increased and decreased, substantially independent of the potential between its common and output electrodes;
   a plurality, $n$ in number, of resistances having respective first ends respectively connected to separate respective ones of the common electrodes of said plurality of current control devices, and having respective second ends;
   means for applying respective input signal potentials, as referred to a reference potential, to the input electrodes of said plurality of current control devices;
   an output signal terminal to which the output electrodes of each of said plurality of current control devices connect;
   resistive load means having a first end connected to said output signal terminal and having a second end;
   means responsive to a first supply voltage received at an input terminal thereof to apply a first operating potential from an output terminal thereof to an interconnection of the second ends of said plurality of resistances, and means responsive to a second supply voltage received at an input terminal thereof to apply a second operating potential from an output terminal thereof to the second end of said resistance load means, said first and second operating voltages having respective direct components respectively of a first polarity and of a second polarity as referred to said reference voltage for conditioning the principal conduction paths of said current control devices to conduct current, said first and second operating voltages having respective ripple components of opposite senses from each other and of predetermined proportions relative to each other; and
   adjustment means, included in one of said means for applying first and second operating voltages, for adjusting the ripple component available from its output terminal thereby to substantially reduce the ripple component in the potential at the first end of said resistive load means, as tends to accompany an output signal potential appearing there responsive to said input signal potential.

6. A combination as set forth in claim 5 wherein the one of said means for applying an operating potential that includes adjustment means includes:
   a further resistance connected between its input and output terminals; and
   an adjustable resistance and a reference diode serially connected between its output terminal and a point at said reference voltage, the adjustment of said adjustable resistance substantially affecting the ripple component of the operating voltage at its output terminal as compared to its affecting the direct component of the operating voltage at its output terminal.

7. A mixer comprising:
   a plurality of current control devices, $n$ in number, each having input and output and common electrodes and having a principal conduction path between its output and common electrodes, the current flow through which path is increased and decreased responsive to the potential between its common and input electrodes being increased and decreased, substantially independently of the potential between its common and output electrodes;
   a plurality, $n$ in number, of resistances having respective first ends respectively connected to separate respective ones of the common electrodes of said plurality of current control devices, and having respective second ends;
   means for applying respective input signal potentials, as referred to a reference potential, to the second ends of said plurality of resistances;
   an output signal terminal to which the output electrodes of each of said plurality of current control devices connect;
   resistive load means having a first end connected to said output signal terminal and having a second end;
   means responsive to a first supply voltage received at an input terminal thereof to apply a first operating potential from an output terminal thereof to an interconnection of the input electrodes of said plurality of current control devices, and means responsive to a second supply voltage received at an input terminal thereof to apply a second operating potential from an output terminal thereof to the second end of said resistance load means, said first and second operating voltages having respective direct components respectively of the same polarity as referred to said reference voltage for conditioning the principal conduction paths of said current control devices to conduct current, said first and second operating voltages having respective ripple components of similar sense to each other and of predetermined proportions relative to each other; and
   adjustment means, included in one of said means for applying first and second operating voltages, for adjusting the ripple component available from its output terminal thereby to substantially reduce the ripple component in the potential at the first end of said resistive load means, as tends to accompany an output signal potential appearing there responsive to said input signal potential.

8. A combination as set forth in claim 7 wherein the one of said means for applying an operating potential that includes adjustment means includes:
- a further resistance connected between its input and output terminals; and
- an adjustable resistance and a reference diode serially connected between its output terminal and a point at said reference voltage, the adjustment of said adjustable resistance substantially affecting the ripple component of the operating voltage at its output terminal as compared to its affecting the direct component of the operating voltage at its output terminal.

9. An amplifier stage comprising:
- first and second terminals for connection to receive a supply potential therebetween;
- a third terminal between which and said first terminal an operating potential derived from said supply potential is to be available;
- first and second resistances, at least one of which is adjustable, said first resistance being connected between said second and third terminals;
- a reference diode being serially connected with said second resistance between said first and third terminals, maintaining in said connection a voltage thereacross which is a substantial fraction of said operating voltage, and exhibiting in said connection a dynamic resistance which is substantially lower than said first and second resistances, whereby there is provided substantial attenuation of ripple components in said operating potential as compared to said supply potential;
- a current control device having input, output and common electrodes and having a principal conduction path between its output and common electrodes, the current flow through which path is increased and decreased responsive to the potential between its common and input electrodes being increased and decreased;
- means for applying a signal, which is referred to the potential at said first terminal and has input signal and ripple components, between the common and input electrodes of said current control device; and
- load means having a direct current path therethrough connected from said third terminal to the output electrode of said current control device to receive said output signal.

* * * * *